(12) United States Patent
Abdennadher

(10) Patent No.: US 6,836,872 B2
(45) Date of Patent: Dec. 28, 2004

(54) ON-CHIP TESTING OF INTEGRATED CIRCUITS

(75) Inventor: Salem Abdennadher, Sacramento, CA (US)

(73) Assignee: Intel Corporation, Santa Clara, CA (US)

(*) Notice: Subject to any disclaimer, the term of this patent is extended or adjusted under 35 U.S.C. 154(b) by 0 days.

(21) Appl. No.: 10/255,155

(22) Filed: Sep. 24, 2002

(65) Prior Publication Data

US 2004/0060017 A1 Mar. 25, 2004

(51) Int. Cl.[7] .......................... G06F 17/50; G06F 11/00; G01R 31/28
(52) U.S. Cl. ............................. 716/4; 714/30; 714/733
(58) Field of Search ........................... 716/1, 3, 4, 18; 714/741, 739, 738, 733, 729, 726, 719, 718, 30; 703/15; 702/181; 365/200; 326/93; 204/173

(56) References Cited

U.S. PATENT DOCUMENTS

| | | | | |
|---|---|---|---|---|
| 4,885,554 A | * | 12/1989 | Wimmer | 331/25 |
| 5,349,539 A | * | 9/1994 | Moriyasu | 703/15 |
| 5,572,712 A | * | 11/1996 | Jamal | 716/18 |
| 6,012,157 A | * | 1/2000 | Lu | 714/741 |
| 6,059,451 A | * | 5/2000 | Scott et al. | 714/726 |
| 6,182,258 B1 | * | 1/2001 | Hollander | 714/739 |
| 6,634,008 B1 | * | 10/2003 | Dole | 716/1 |
| 2002/0138800 A1 | * | 9/2002 | Kim et al. | 714/719 |
| 2003/0065996 A1 | * | 4/2003 | Shimada et al. | 714/718 |
| 2003/0070118 A1 | * | 4/2003 | Nakao et al. | 714/30 |
| 2003/0115525 A1 | * | 6/2003 | Hill et al. | 714/726 |

OTHER PUBLICATIONS

Farshbaf, "Fault simulation for VHDL based test bench and BIST evaluation", Nov. 19–21, 2001,Test Symposium, 2001. Proceedings. 10th Asian , pp.:396–401.*

* cited by examiner

Primary Examiner—Leigh M. Garbowski
Assistant Examiner—Helen Rossoshek
(74) Attorney, Agent, or Firm—Fish & Richardson P.C.

(57) ABSTRACT

A method comprises inserting into a behavioral model of an integrated circuit component a corresponding built-in self-test structure from a library of built-in self-test structures that correspond to integrated circuit components and using the behavioral model to verify whether the inserted built-in self-test structure would detect a fault in the component.

16 Claims, 1 Drawing Sheet

ON-CHIP TESTING OF INTEGRATED CIRCUITS

BACKGROUND

This disclosure relates to on-chip testing of integrated circuits.

Built in self test ("BIST") structures are design-for test ("DFT") structures that may be included as part of an integrated circuit ("IC"). These on-chip structures allow for internal testing of IC components instead of more time-consuming external tests.

A BIST structure may be automatically incorporated during the design stage of an IC's development. When the chip is produced, the BIST structure allows for a relatively efficient means of detecting a fault in an IC component.

DETAILED DESCRIPTION

Figure 1:
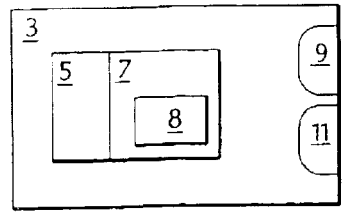
FIG. 1 is a block diagram of a device used for designing integrated circuits.

FIG. 1 shows a device 3 which includes circuitry, such as a processor 5, and memory 7. A library 8, described below, may be stored in the memory 7. At least one input interface 9 and one output interface 11 are provided for communications with a user operating the device 3.

Figure 2:
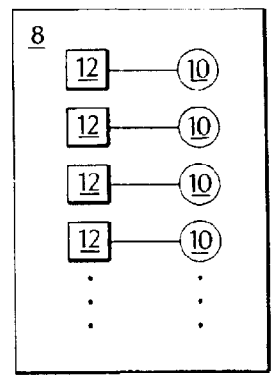
FIG. 2 is a block diagram of a BIST structure template library.

As shown in FIG. 2, the library 8 includes BIST structure templates 12 that correspond to various possible IC components 10. The contents of the library 8 may be obtained from another source or created by the user directly in the memory 7 of the device 3. The library 8 may include BIST structure templates 12 for all of the possible integrated circuit components 10 that may be used in an integrated circuit, or limited to a subset of only those envisioned to be used in a particular integrated circuit.

A large IC can be designed using the device 3 and executing a computer aided design ("CAD") tool such as Analog Artist™, available from Cadence Design Systems, Inc., with the device's processor 5 and memory 7. When an analog component 10 from the library 8 is added to the IC design, a behavioral model of the component is created.

Figure 3:
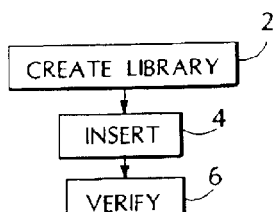
FIG. 3 is a flow chart of BIST integration into an integrated circuit.

As illustrated by FIG. 3, the integration of BIST structures 12 for a mixed signal IC begins with the creation 2 of a library 8, insertion 4 of a BIST structure 12 from the library into a model of a component 10, and the verification 6 of the BIST using behavioral or transistor level modeling.

Figure 4:
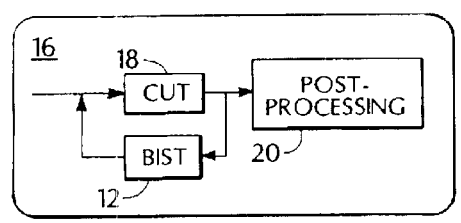
FIGS. 4–6 are block diagrams of examples of BIST implementations.

FIG. 4 illustrates an example of a behavioral model 16. The behavioral model 16 includes a simulation of the IC component, shown as the circuit under test (CUT) 18 in FIG. 4. The corresponding BIST structure template 12 from the library 8 may be inserted automatically (FIG. 3) into the model 16.

The behavioral model 16 may be used to verify whether the BIST structure 12 will detect various faults in the CUT 18. As part of the verification, a predetermined error may be injected into the CUT's 18 output, and the output may be subject to post-processing 20 to verify whether the BIST structure 12 properly detects the error. If it does not detect the error, the BIST structure 12 may be adjusted until the post-processing 20 shows that it will detect the errors.

Verification may be accomplished, for example, using block level modeling in a hardware description language ("HDL") such as VHDL_AMS. This type of modeling can be used for behavioral model simulation and allows for changing the model's parameters in verifying the design. Additional transistor level verification also may be made as necessary in this environment to provide a more detailed verification of the design's efficacy.

The nature of the behavior model 16 created depends upon the CUT 18. For example, the BIST structure 12 for a phase-locked loop ("PLL") component may differ from the BIST 12 for a filter component.

It is sometimes difficult to include BIST structures automatically in mixed signal integrated circuits, which include both digital and analog components. This is because existing analog BIST structures are designed for specific integrated circuits. One possible advantage of the present technique is to allow the design and implementation of BIST structures for analog components in mixed signal integrated circuits.

Figure 5:
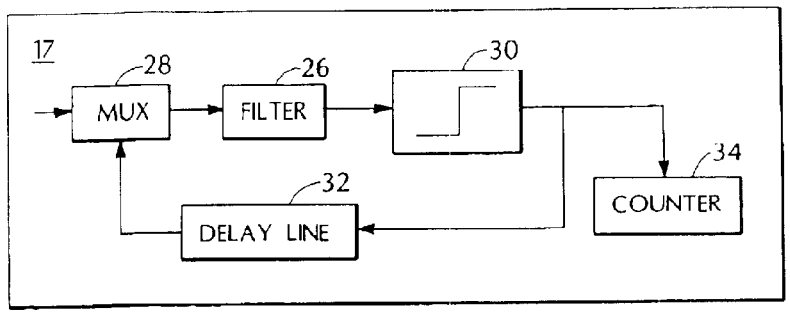

An example of a mixed signal BIST behavioral model 17 is shown in FIG. 5. In this example, the circuit under test is an analog filter 26. The filter 26 is provided with feedback circuitry that includes a multiplexer (MUX) 28, a one-bit comparator 30, and a programmable delay line 32. During operation the circuit acts as an oscillator. Post-processing 20 may involve the use of a counter 34 to determine the frequency of oscillation.

The delay line 32 may include, for example, cascading flip-flops in series, with the number of flip-flops used dependant on the type of filter 26 and its order. In the event of a fault in the filter 26, the filter's output would not oscillate or there would be a change in the oscillation frequency with respect to a predetermined standard.

The ability of the BIST to detect faults may be verified by executing a simulation using the behavioral model 17. A predefined error may be injected into the output of the simulated filter 26. The oscillation frequency of the simulated feedback loop, as detected by the counter 34, is then mapped to the specifications of the filter 26. The feedback loop should cause an absence of oscillation or change in the oscillation frequency when an appropriate error is inserted into the circuit under test, thus indicating a fault in the filter. Flip-flops may be added or removed as necessary from the simulated delay line 32 to achieve the desired results as part of the verification.

Figure 6:
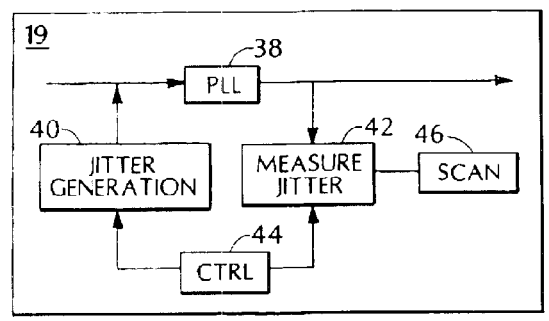

Another mixed signal BIST structure is shown in FIG. 6. In this example, the circuit under test is a phase-locked loop 38. A jitter generator unit 40, an on-chip intrinsic jitter measurement block 42 and a control block 44 are inserted into the behavioral model 19. The jitter generator unit 40 is included to inject pre-defined jitter into the phase-locked loop output for verification purposes. The jitter measuring block 42 may use a time-to-digital conversion ("TDC") technique to analyze the jitter. A scan block 46 determines and indicates whether the phase-locked loop passes or fails the self-test based on the analyses of the jitter measurement block 42. The control block 44 may be used to begin and end the self-test.

Building blocks for implementing the time-to-digital technique may be modeled, for example, using a hardware description language such as VHDL_AMS. Those building blocks may be compiled and included to the library 8. The models may be used for the simulation instead of the corresponding transistor level representations. By using a mixed signal hardware definition language such as VHDL-AMS, the circuit can be modeled at different levels of abstraction, both digital and analog. This allows the BIST structure to be modified as necessary, at the design stage, to the level of sensitivity desired.

During the verification stage the jitter generator 40 may inject a predetermined jitter into the output of the phase-locked loop. The building blocks of the time-to-digital technique then may be modified until the BIST can properly detect the injected error.

Various features of the system may be implemented in hardware, software or a combination of hardware and software. For example, some aspects of the system can be implemented in computer programs executing on programmable computers. Each program can be implemented in a high level procedural or object-oriented programming language to communicate with a computer system. Furthermore, each such computer program can be stored on a storage medium, such as read only memory (ROM) readable by a general or special purpose programmable computer, for configuring and operating the computer when the storage medium is read by the computer to perform the functions described above.

Other implementations are within the scope of the following claims.

What is claimed is:

1. A method comprising:
   inserting into a behavioral model of an integrated circuit component a corresponding built-in self-test structure from a library of built-in self-test structures that correspond to integrated circuit components; and
   using the behavioral model to verify whether the inserted built-in self-test structure would detect a fault in the component, wherein verifying whether the built-in self-test structure would detect a fault includes:
      inserting a predetermined fault into an output of a simulated filter; and
      using a counter in the built-in self-test structure to determine a change in an oscillation frequency caused by the fault.

2. The method of claim 1 including automatically inserting the built-in self-test structure into the behavioral model if the corresponding integrated circuit component is included in a design of an integrated circuit.

3. The method of claim 1 including:
   modifying the built-in self-test structure in the behavioral model if the built-in self-test fails to detect a fault in the component; and
   using the behavioral model to verify whether the modified built-in self-test structure would detect a fault in the component.

4. The method of claim 1 wherein verifying whether the inserted built-in self-test structure would detect a fault in the integrated circuit component includes:
   observing whether the built-in self-test structure properly detects the inserted fault.

5. The method of claim 1 including adjusting a number of flip-flops in a feedback loop in the built-in self-test structure if the fault is not detected.

6. An apparatus comprising:
   memory to store a library of built-in self-test structures each of which corresponds respectively to an integrated circuit component; and
   circuitry to insert into a behavioral model of an integrated circuit component a corresponding built-in self-test structure from the library and use the behavioral model to verify whether the inserted built-in self-test structure would detect a fault in the component,
   wherein the integrated circuit component includes a filter, and the built-in self-test structure corresponding to the filter includes:
      a multiplexer coupled to an input of the filter;
      a one-bit comparator coupled to an output of the filter;
      a delay line coupled between an output of the comparator output and an input of the multiplexer, and wherein the multiplexer, filter, comparator and delay line form a feedback loop; and
      a counter coupled to an output of the comparator output to determine a frequency of oscillation of the feedback loop.

7. The apparatus of claim 6 wherein the circuitry is to automatically insert the built-in self-test structure if the corresponding integrated circuit component is included in a design of an integrated circuit.

8. The apparatus of claim 6 wherein the circuitry is to:
   modify the built-in self-test structure in the behavioral model if the built-in self-test fails to detect a fault in the component; and
   use the behavioral model to verify whether the inserted built-in self-test structure would detect a fault in the component.

9. The apparatus of claim 6 wherein the circuitry is to verify that the inserted built-in self-test structure would detect a fault in the integrated circuit component by inserting a predetermined fault into the behavioral model and observing whether the built-in self-test structure properly detects that fault.

10. The apparatus of claim 6 wherein the circuitry is to verify whether the built-in self-test structure would detect a fault in the filter by inserting a predetermined fault into the output of the filter and using the counter to determine a change in the oscillation frequency caused by the fault.

11. The apparatus of claim 10 wherein the circuitry is to adjust a number of flip-flops in the delay line if the fault is not detected.

12. An article comprising a machine-readable medium storing instructions that when executed by a machine result in:
   insertion into a behavioral model of an integrated circuit component a corresponding built-in self-test structure from a library of built-in self-test structures that correspond to integrated circuit components: and
   use of the behavioral model to verify whether the inserted built-in self-test structure would detect a fault in the component, including:
      insertion of a predetermined fault into an output of a simulated filter; and
      use of a counter in the built-in self-test structure to determine a change in the oscillation frequency caused by the fault.

13. The article of claim 12 including instructions that results in the built-in self-test structure being inserted automatically into the behavioral model if the corresponding integrated circuit component is included in a design of an integrated circuit.

14. The article of claim 12 including instructions that result in:
   modification of the built-in self-test structure in the behavioral model if the self-test fails to detect a fault in the component; and
   use of the behavioral model to verify whether the inserted built-in self-test structure would detect a fault in the component.

15. The article of claim 12 including instructions that result in:
- insertion of a predetermined fault into the behavioral model; and
- observation of whether the built-in self-test structure properly detects the predetermined fault.

16. The article of claim 12 including instructions that result in a number of flip-flops in a delay line in a feedback loop in a built-in self-test structure to be adjusted if the fault is not detected.

* * * * *